(12) United States Patent
Tehrani et al.

(10) Patent No.: US 10,191,804 B2
(45) Date of Patent: Jan. 29, 2019

(54) UPDATING RELIABILITY DATA

(71) Applicant: Micron Technology, Inc., Boise, ID (US)

(72) Inventors: Saeed Sharifi Tehrani, San Diego, CA (US); Nicholas J. Richardson, San Diego, CA (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 15/157,042

(22) Filed: May 17, 2016

(65) Prior Publication Data

US 2016/0259686 A1    Sep. 8, 2016

Related U.S. Application Data

(62) Division of application No. 13/649,822, filed on Oct. 11, 2012, now Pat. No. 9,612,903.

(51) Int. Cl.
| | |
|---|---|
| *G06F 11/10* | (2006.01) |
| *G11C 29/52* | (2006.01) |
| *H03M 13/11* | (2006.01) |
| *H03M 13/00* | (2006.01) |

(52) U.S. Cl.
CPC ...... *G06F 11/1012* (2013.01); *G06F 11/1068* (2013.01); *G11C 29/52* (2013.01); *H03M 13/114* (2013.01); *H03M 13/116* (2013.01); *H03M 13/1108* (2013.01); *H03M 13/1137* (2013.01); *H03M 13/6577* (2013.01)

(58) Field of Classification Search
None
See application file for complete search history.

(56) References Cited

U.S. PATENT DOCUMENTS

| | | | |
|---|---|---|---|
| 7,120,856 B2 | 10/2006 | Zhang et al. | |
| 7,676,734 B2 | 3/2010 | Yamagishi | |
| 7,730,377 B2 | 6/2010 | Hocevar | |
| 7,886,208 B2 | 2/2011 | Moon et al. | |
| 7,937,648 B2 | 5/2011 | Yokokawa | |

(Continued)

FOREIGN PATENT DOCUMENTS

| | | |
|---|---|---|
| JP | 2007174027 | 7/2007 |
| JP | 2007208985 | 8/2007 |

(Continued)

OTHER PUBLICATIONS

Hocevar, Dale E.,"A Reduced Complexity Decoder Architecture via Layered Decoding of LDPC Codes", 2004 IEEE Workshop on Signal Processing Systems, Oct. 13, 2004, pp. 107-112.

(Continued)

*Primary Examiner* — Justin R Knapp
(74) *Attorney, Agent, or Firm* — Brooks, Cameron & Huebsch, PLLC

(57) ABSTRACT

The present disclosure includes apparatuses and methods related to updating reliability data. A number of methods can include receiving, at a variable node, either a first reliability data value with a first hard data value or a second reliability data value with a second hard data value, sending the first hard data value or the second hard data value to each check node coupled to the variable node according to a parity check code, and updating the reliability data based on input from less than all of the check nodes.

20 Claims, 6 Drawing Sheets

(56) References Cited

U.S. PATENT DOCUMENTS

| | | |
|---|---|---|
| 9,214,962 B2* | 12/2015 | Murakami ......... H03M 13/1154 |
| 2003/0023917 A1 | 1/2003 | Richardson et al. |
| 2006/0107193 A1 | 5/2006 | Park et al. |
| 2006/0123318 A1 | 6/2006 | Kim et al. |
| 2006/0190797 A1 | 8/2006 | Xin |
| 2007/0089016 A1 | 4/2007 | Bhatt et al. |
| 2008/0077843 A1 | 3/2008 | Cho et al. |
| 2008/0294970 A1 | 11/2008 | Gross et al. |
| 2009/0164540 A1 | 6/2009 | Oh et al. |
| 2010/0037121 A1 | 2/2010 | Jin et al. |
| 2010/0074381 A1 | 3/2010 | Gross et al. |
| 2010/0131819 A1* | 5/2010 | Graef ................. H03M 13/1117 714/752 |
| 2010/0192036 A1 | 7/2010 | Sandberg et al. |
| 2010/0269011 A1 | 10/2010 | Oh et al. |
| 2011/0010602 A1 | 1/2011 | Chung et al. |
| 2011/0087946 A1 | 4/2011 | Planjery et al. |
| 2011/0154150 A1 | 6/2011 | Kang et al. |
| 2011/0314352 A1 | 12/2011 | Djordjevic et al. |
| 2011/0314652 A1 | 12/2011 | Djordjevic et al. |
| 2012/0173954 A1 | 7/2012 | Yamagishi |
| 2012/0246536 A1 | 9/2012 | Ng et al. |

FOREIGN PATENT DOCUMENTS

| | | |
|---|---|---|
| JP | 2010178328 | 8/2010 |
| JP | 2012182623 | 9/2012 |
| KR | 10-2009-0062086 | 6/2009 |

OTHER PUBLICATIONS

Inaba et al, "Peformance of Low Density Parity Check (LDPC) Codes with Bootstrap Decoding Algorithm on a Fast Fading Channel", vol. 1, 2004 IEEE 59th Vehicular Technology Conference, May 17, 2004, pp. 333-337.

Cho et al., "VLSI Implementation of a Soft Bit-Flipping Decoder for PG-LDPC Codes", 2009 IEEE International Symposium on Circuits and Systems, May 24, 2009, pp. 908-911.

Extended European Search Report for related EP Patent Application No. 13845345.1, dated Jun. 8, 2016, 11 pages.

Notice of Rejection for related Korea Patent Application No. 10-2015-7012064, dated Oct. 31, 2016, 9 pages.

Leiner, "LDPC Codes—A Brief Tutorial," Apr. 8, 2005, 9 pages.

Zhou, et al., "Improved Iterative Bit Flipping Decoding Algorithms for LDPC Convolutional Codes," Jan. 14, 2010, pp. 541-544,IEEE Xplore.

International Search Report and Written Opinion of related international application No. PCT/US2013/063843, dated Jan. 29, 2014, 12 pp.

Notice of Rejection for related Japan Patent Application No. 2015-536834, dated Mar. 1, 2016, 11 pages.

Notice of Rejection for related Korea Patent Application No. 10-2015-7012064, dated Apr. 28, 2016, 9 pages.

Communication Pursuant to Article 94(3) EPC for related EP Patent Application No. 13845345.1, dated Aug. 11, 2017, 6 pages.

EP Communication Pursuant to Article 94(3) EPC for related EP Application No. 13845345.1, dated Jul. 24, 2018, 8 pages.

* cited by examiner

UPDATING RELIABILITY DATA

PRIORITY INFORMATION

This application is a Divisional of U.S. application Ser. No. 13/649,822, filed Oct. 11, 2012, the contents of which are included herein by reference.

TECHNICAL FIELD

The present disclosure relates generally to semiconductor memory and methods, and more particularly, to apparatuses and methods related to updating reliability data.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error information, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

Memory is utilized as volatile and non-volatile data storage for a wide range of electronic applications. Non-volatile memory may be used in portable electronic devices, such as laptop computers, portable memory sticks, digital cameras, cellular telephones, portable music players such as MP3 players, movie players, and other electronic devices. Memory cells can be arranged into arrays, with the arrays being used in memory devices.

When data is sent (e.g., communicated, passed, transferred, transmitted, etc.) from one location to another there is the possibility that an error may occur. Errors can also occur over time while data is stored in a memory. There are a number of techniques that can be used to encode data so that an error can be detected and/or corrected. Since data is routinely sent to and from memory, and stored therein, memory can employ error correction techniques to attempt to correct data associated with the memory.

One type of error correction relies on low-density parity-check (LDPC) codes. Unencoded (e.g., "raw") data can be encoded into codewords for transmission and/or storage. The codewords can subsequently be decoded to recover the data. Powerful error correction may be desired but balanced against latency, throughput, and/or power constraints such as those imposed by portable electronic devices.

DETAILED DESCRIPTION

Figure 1:
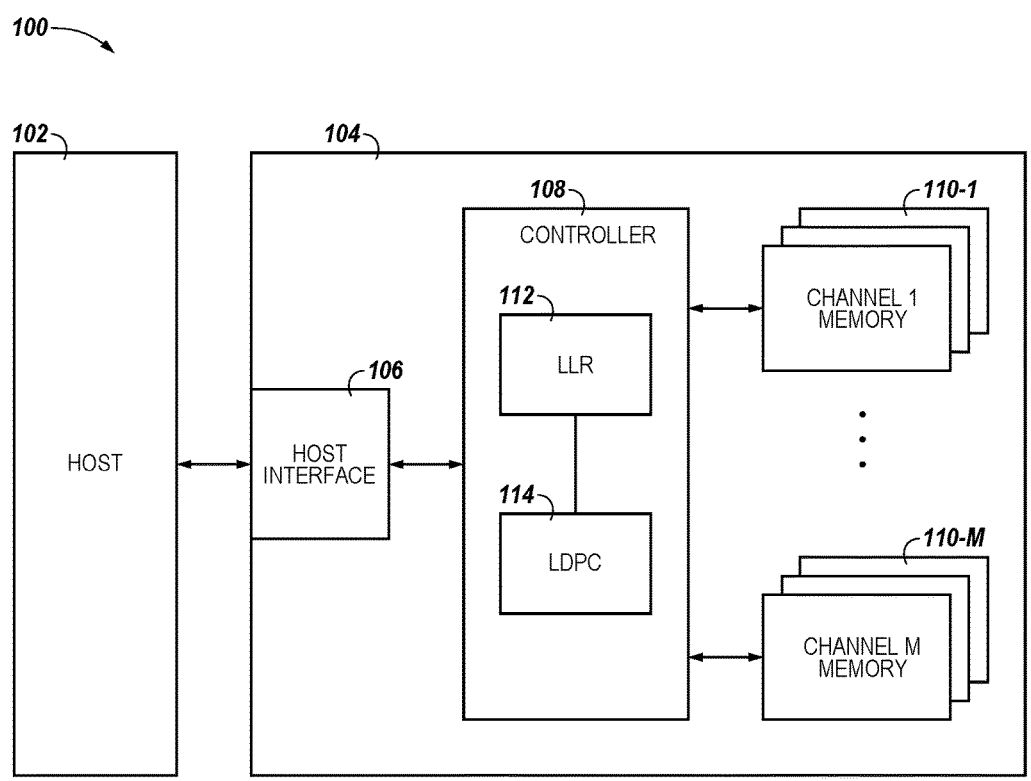
FIG. 1 is a block diagram of an apparatus in the form of a computing system including at least one memory system in accordance with a number of embodiments of the present disclosure.

The present disclosure includes apparatuses and methods related to updating reliability data. A number of methods can include receiving, at a variable node, either a first reliability data value (e.g., a maximum reliability data value) with a first hard data value or a second reliability data value (e.g., a minimum reliability data value) with a second hard data value, sending the first hard data value or the second hard data value to each check node coupled to the variable node according to a parity check code, and updating the reliability data based on input from less than all of the check nodes. For example, a reliability circuit can be configured to provide specific reliability data values for particular hard data values, such as a maximum reliability data value in response to a first hard data value or a minimum reliability data value in response to a second hard data value (e.g., in hard data mode). However, in soft or semi-soft modes, the reliability circuit can be configured to provide other initial reliability data values (e.g., between a maximum and a minimum value).

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "C", "N", "M", "P", and "V" particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 114 may reference element "14" in FIG. 1, and a similar element may be referenced as 314 in FIG. 3. As will be appreciated, elements shown in the various embodiments herein can be added, exchanged, and/ or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-M (e.g., solid state memory devices such as NAND Flash devices), which provide a storage volume for the memory system 104. In another embodiment, the memory system 104 may be a single memory device.

As illustrated in FIG. 1, the controller 108 can be coupled to the host interface 106 and to the memory devices 110-1, . . . , 110-M via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the number of memory devices 110-1, . . . , 110-M (which in some embodiments can be a number of memory arrays on a single die) to control data read, write, and erase operations, among other operations. In some embodiments, the controller 108 can be on the same die or a different die than any or all of the number of memory devices 110.

Although not specifically illustrated, in some embodiments, the controller 108 can include a discrete memory channel controller for each channel coupling the controller 108 to the memory devices 110-1, . . . , 110-M. The controller 108 can include, for example, a number of components in the form of hardware and/or firmware (e.g., one or more integrated circuits) and/or software for controlling access to the number of memory devices 110-1, . . . , 110-M and/or for facilitating data transfer between the host 102 and memory devices 110-1, . . . , 110-M.

As illustrated in FIG. 1, the controller 108 can include a reliability circuit 112 and an error correction circuit 114. For example, the reliability circuit 112 can be a log likelihood ratio (LLR) circuit and/or the error correction circuit 114 can be a low density parity check (LDPC) circuit. Each of the reliability circuit 112 and an error correction circuit 114 can be discrete components such as an application specific integrated circuit (ASIC) or the components may reflect functionally provided by circuitry within the controller 108 that does not necessarily have a discrete physical form separate from other portions of the controller 108. Although illustrated as components within the controller 108 in FIG. 1, each of the reliability circuit 112 and an error correction circuit 114 can be external to the controller 108 or have a number of components located within the controller 108 and a number of components located external to the controller 108.

An error correction circuit 114 can include two types of processing nodes: variable nodes and check nodes. The processing nodes can be coupled according to the code's parity check code. In a number of embodiments of the present disclosure, the variable nodes can be implemented as circulant memories and the check nodes can be implemented as circuits that compute (e.g., calculate) parity data (e.g., perform a syndrome check) and/or increment and/or decrement reliability data, among other functions. As such, the check nodes can include XOR circuits and/or up/down counters, among other circuitry. In a number of embodiments, the variable nodes can be implemented as up/down counters (e.g., saturating up/down counters) and the check nodes can be implemented as combinational logic (e.g., exclusive or (XOR) circuits). The input to the error correction circuit 114 can be hard data from the memory 110 as received from the reliability circuit 112 (e.g., included with reliability data from the reliability circuit 112). An LLR value can be stored for each variable node and the LLR value can be updated during each layer (or some multiple of the layers, or once per iteration, for example) of decoding as described herein.

In a number of embodiments, the input to the error correction circuit 114 can comprise semi-soft data or full-soft data (e.g., in response to a failure of a syndrome check on the hard data and/or the semi-soft data). Hard data is data that corresponds only to the data state of a memory cell. For example, a 2-bit memory cell can be programmed to one of four data states, where each data state corresponds to one of data 00, 01, 10, or 11. For example, the hard data (of the most significant bit (MSB) of data states 00 and 01 is 0 while the hard data of data states 10 and 11 is 1 (of the MSB). In contrast, soft data associated with a memory cell can indicate a location of a state (e.g., threshold voltage (Vt)) stored on the memory cell within a distribution of states (e.g., Vt distribution) representing the target state to which the memory cell was programmed. Additionally, soft data associated with a memory cell can indicate a probability of whether the state of the memory cell corresponds to the target state to which the memory cell was programmed. A memory device can be configured to determine a particular number of soft data bits for hard data read therefrom. For the 2-bit memory cell described above, an example of soft data could include a greater resolution that uses four bits, which could represent up to sixteen different states. Semi-soft data indicates that less than all of the soft data is sent with the hard data. Full-soft data indicates that all of the soft data is sent with the hard data. Additional functionality associated with the controller 108 is described in more detail herein.

The number of memory devices 110-1, . . . , 110-M can include a number of arrays of memory cells (e.g., non-volatile memory cells). The arrays can be Flash arrays with a NAND architecture, for example. However, embodiments are not limited to a particular type of memory array or array architecture. The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, ..., 110-M of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

FIGS. 2A-2I illustrate flow diagrams for updating reliability data in accordance with a number of embodiments of the present disclosure. Although not specifically illustrated in FIGS. 2A-2I, an error correction circuit implementing an LDPC scheme can include a multitude of variable nodes and check nodes coupled according to a parity check code. LDPC codes are a class of binary linear block codes in which a set of codewords spans the null space of a sparse parity check matrix H. LDPC codes can be represented by a bipartite graph called a factor graph, which illustrates the variable nodes, check nodes, and the connections therebetween. The LDPC decoding process can also be referred to as an iterative message passing process over the edges (connections between nodes) of the factor graph.

Figure 2A:
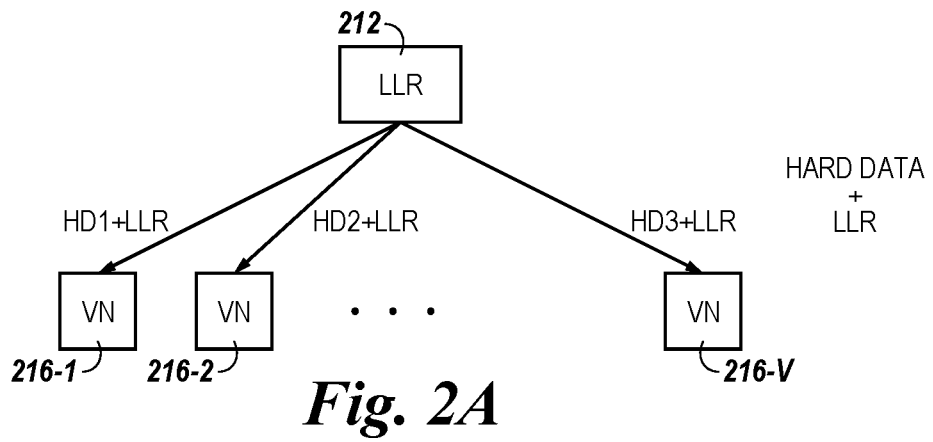
FIGS. 2A-2I illustrate flow diagrams for updating reliability data in accordance with a number of embodiments of the present disclosure.

FIG. 2A illustrates an initialization step where reliability data including hard data is received at a number of variable nodes 216-1, 216-2, ..., 216-V from a reliability circuit 212 (e.g., an LLR circuit). The reliability data including hard data received by each of the variable nodes 216-1, 216-2, ..., 216-V is not necessarily the same (e.g., variable node 216-1 can receive hard data "HD1," variable node 216-2 can receive hard data "HD2," and variable node 216-V can receive hard data "HD3") as the hard data values can be derived from a codeword read from a memory device. The hard data (e.g., a codeword) can be read from a memory device (e.g., memory device 110 illustrated in FIG. 1) and received by the reliability circuit 212 for determination (e.g., assignment, generation, etc.) of reliability data, which is to include the hard data. Although not specifically illustrated, the reliability circuit 212 can provide semi-soft data and/or full-soft data to the variable nodes 216-1, 216-2, ..., 216-V (e.g., in response to a failed syndrome check for the hard data and/or the semi-soft data).

The reliability data can be generated by the reliability circuit 212. A variable node 216-1, 216-2, ..., 216-V can receive either a first reliability data value (e.g., a maximum reliability data value) with a first hard data value or a second reliability data value (e.g., a minimum reliability data value) with a second hard data value (e.g., in hard data mode). The reliability circuit 212 can be configured to provide specific reliability data values for particular hard data values, such as a maximum reliability data value in response to a first hard data value or a minimum reliability data value in response to a second hard data value (e.g., in hard data mode). However, in soft or semi-soft modes, the reliability circuit 212 can be configured to provide other initial reliability data values (e.g., between a maximum and a minimum value).

The variable nodes 216-1, 216-2, ..., 216-V can store the received reliability data, for example, a first reliability data value in response to a hard data input having a first hard data value (e.g., first binary value) or a second reliability data value in response to the hard data input having a second hard data value (e.g., second binary value). In a number of embodiments, the reliability data can be a two's complement representation of an LLR value. For example, the two's complement value can be ≥0 (e.g., a maximum LLR value) for "0" hard data values and the two's complement value can be <0 (e.g., a minimum LLR value) for "1" hard data values received from the memory.

The reliability circuit 212 can be configured to provide a maximum or minimum LLR value for respective hard data values as initial inputs to the error correction circuit (e.g., error correction circuit 114 illustrated in FIG. 1). In a three-bit implementation (e.g., including one bit of hard data and a two-bit count collectively representing the reliability data), the "0" hard data value can correspond to a two's complement LLR value of +3 and the "1" hard data value can correspond to a two's complement LLR value of −4. The following table illustrates a correspondence between a three-bit value that includes one bit of hard data, two bits of reliability data, and a two's complement value representing the reliability data:

TABLE 1

| 3-bit Value | Hard Data | 2's Complement LLR |
|---|---|---|
| 000 | 0 | 0 |
| 001 | 0 | 1 |
| 010 | 0 | 2 |
| 011 | 0 | 3 |
| 100 | 1 | −4 |
| 101 | 1 | −3 |
| 110 | 1 | −2 |
| 111 | 1 | −1 |

As illustrated in Table 1, the most significant bit (MSB) of the three-bit value can comprise the hard data value. Although not illustrated in Table 1, the two's complement LLR can be automatically set to a particular value (such as a maximum or minimum value) based on the hard data. Thus, the two's complement LLR values of 0, 1, and 2 can be initially set to 3 and the two's complement LLR values of −3, −2, and −1 can be initially set to −4. Embodiments are not limited to a three-bit implementation, the respective correspondence of hard data values to LLR values, using maximum and minimum LLR values, or using two's complement representation (e.g., as other representations such as sign-magnitude can be used) which are used to illustrate an example implementation to facilitate understanding of the present disclosure.

Figure 2B:
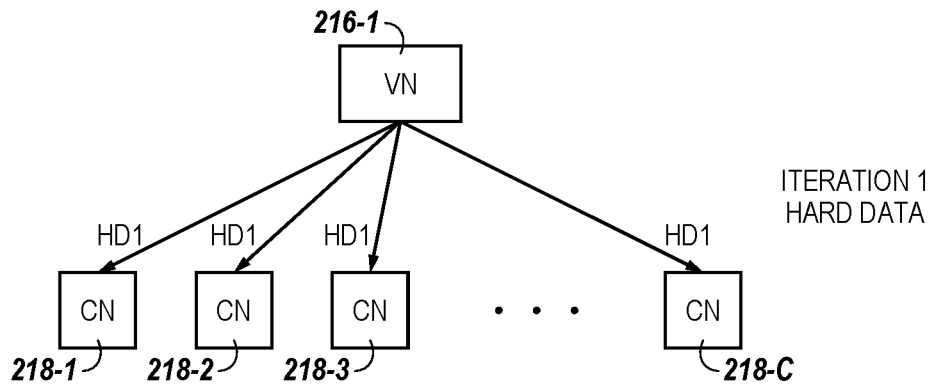

FIG. 2B illustrates a particular variable node 216-1 and a plurality of check nodes 218-1, 218-2, 218-3, ..., 218-C coupled to the particular variable node 216-1 according to a parity check code. During a first iteration, each of the variable nodes (e.g., variable nodes 216-1, 216-2, ..., 216-V illustrated in FIG. 2A) can send the hard data to each of the plurality of check nodes coupled thereto (e.g., variable node 216-1 can send hard data "HD1" to check nodes 218-1, 218-2, 218-3, ..., 218-C). The variable node 216-1 can send the same hard data to each check node 218-1, 218-2, 218-3, ..., 218-C.

Although not specifically illustrated in FIG. 2B, the particular variable node 216-1 can send the stored reliability data including the hard data to the check nodes 218-1, 218-2, 218-3, ..., 218-C coupled thereto. In a number of embodiments, the particular variable node 216-1 can include an up/down counter, in which case the particular variable node 216-1 can send the hard data without the reliability data because the particular variable node 216-1 can update the reliability data. In some embodiments, the particular variable node 216-1 can be a memory without a counter, in which case the particular variable node can send the reliability data including the hard data so that the check nodes 218-1, 218-2, 218-3, . . . , 218-C can update the reliability data.

Figure 2C:
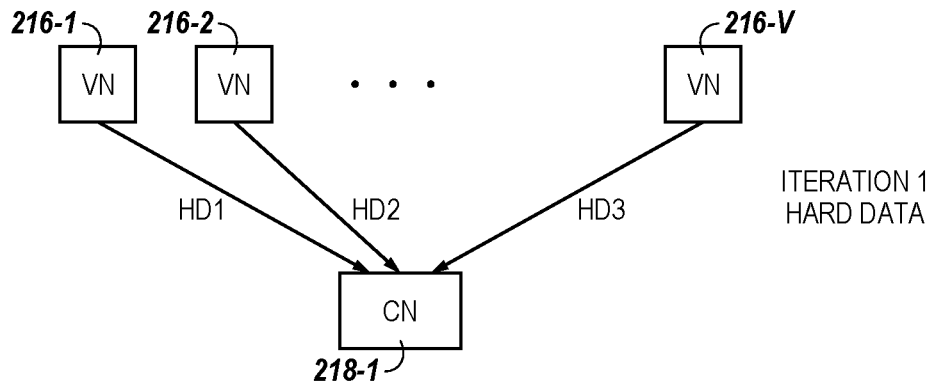

FIG. 2C illustrates a particular check node 218-1 receiving, during the first iteration, a respective hard data value from each of a number of variable nodes 216-1, 216-2, . . . , 216-V that are coupled to the particular check node 218-1. As described herein, the respective hard data values received from each of the variable nodes 216-1, 216-2, . . . , 216-V can be independent of the other hard data values, thus FIG. 2C shows the hard data as "HD1" from variable node 216-1, "HD2" from variable node 216-2, and "HD3" from variable node 216-V. The use of different designators for the hard data does not imply that the respective hard data values are different (e.g., it is possible that all of the values are the same, such as "1"s). In a number of embodiments, the particular check node 218-1 can receive a respective reliability data value with the hard data value from each of the number of variable nodes 216-1, 216-2, . . . , 216-V coupled thereto.

The check node 218-1 can compute parity data based at least in part (e.g., in some embodiments, based only) on the received respective hard data values (e.g., perform a syndrome check). For example, the check node 218-1 can compute first parity data by performing an XOR operation on the hard data values from each of the variable nodes 216-1, 216-2, . . . , 216-V. The check node 218-1 can compute second parity data by performing an XOR operation on the first parity and respective hard data received from a respective variable node (e.g., variable node 216-1). The second parity data can be sent to the respective variable node as described in more detail below. In a number of embodiments, each check node (e.g., check nodes 218-1, 218-2, 218-3, . . . , 218-C) can compute parity data once per clock cycle.

Figure 2D:
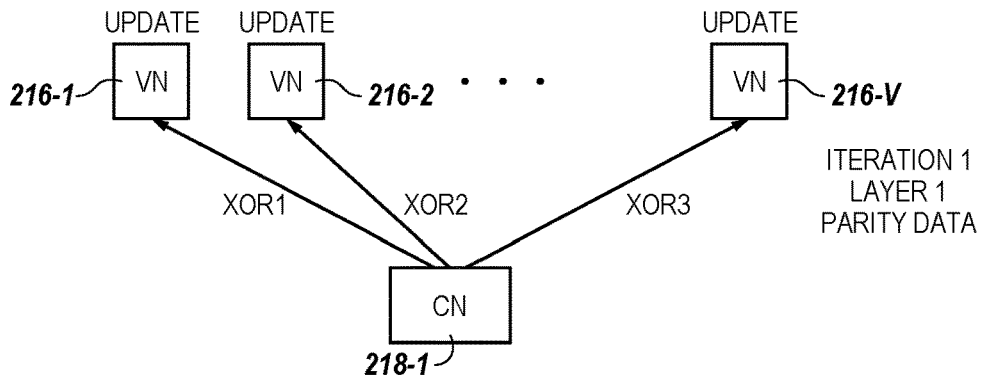

FIG. 2D illustrates a particular check node 218-1 sending respective parity data to respective variable nodes 216-1, 216-2, . . . , 216-V. The parity data can be the second parity data described above (e.g., computed based at least in part (e.g., in some embodiments, based only) on an XOR of the hard data from a respective variable node with a result of an XOR of all of the hard data received by the check node 218-1). Thus, FIG. 2D illustrates the check node 218-1 sending parity data "XOR1" to variable node 216-1, sending parity data "XOR2" to variable node 216-2, and sending parity data "XOR3" to variable node 216-V. The parity data sent from the check node 218-1, as illustrated in FIG. 2D can be part of a first layer of the first iteration. The layered approach to message passing is described in more detail below. The parity data can effectively replace the hard data sent from the variable nodes 216-1, 216-2, . . . , 216-V as updated hard data. In a number of embodiments, the particular check node 218-1 can send the respective reliability data along with the respective parity data to respective variable nodes 216-1, 216-2, . . . , 216-V. The respective reliability data can be the same reliability data sent by the respective variable nodes 216-1, 216-2, . . . , 216-V, or the reliability data can be updated by the check node 218-1 prior to transmission.

Each of the variable nodes 216-1, 216-2, . . . , 216-V can update their respectively stored reliability data based at least in part (e.g., in some embodiments, based only) on their respectively received parity data from the check node 218-1 and/or updated reliability data received from the check node 218-1. In a number of embodiments, the variable nodes 216-1, 216-2, . . . , 216-V can update their respective reliability data by incrementing or decrementing the reliability data value based at least in part (or, in some embodiments, based only) on the parity data received from the particular check node 218-1 (e.g., without regard to parity data received from any other check nodes during a past, current, or future layer of the iteration, or a different iteration of the message passing algorithm). The variable nodes 216-1, 216-2, . . . , 216-V can increment or decrement the stored reliability data once per clock cycle. With respect to those embodiments that include maximum and/or minimum reliability data values stored at the variable nodes 216-1, 216-2, . . . , 216-V, the reliability data value can be incremented and/or decremented within a range defined by the maximum and minimum values such that, for example, if the reliability data value is already at a maximum, and the received parity data value calls for the reliability data value to be incremented, it will not be incremented. In a number of embodiments, the variable nodes 216-1, 216-2, . . . , 216-V can update their respective reliability data by storing the updated reliability data received from the particular check node 218-1.

FIGS. 2E-2H illustrate four layers of an iteration of message passing from those check nodes 218-1, 218-2, 218-3, . . . , 218-C coupled to a particular variable node 216-1. In a number of embodiments, one layer can include incrementing or decrementing the stored reliability data value at the variable node 216-1 based at least in part (or, in some embodiments, based only) on parity data from one of the check nodes 218-1, 218-2, 218-3, . . . , 218-C coupled to the particular variable node 216-1. In a number of embodiments, one layer can include updating the stored reliability data value at the variable node 216-1 based at least in part (or, in some embodiments, based only) on the updated reliability data from one of the check nodes 218-1, 218-2, 218-3, . . . , 218-C coupled to the particular variable node 216-1.

Figure 2E:
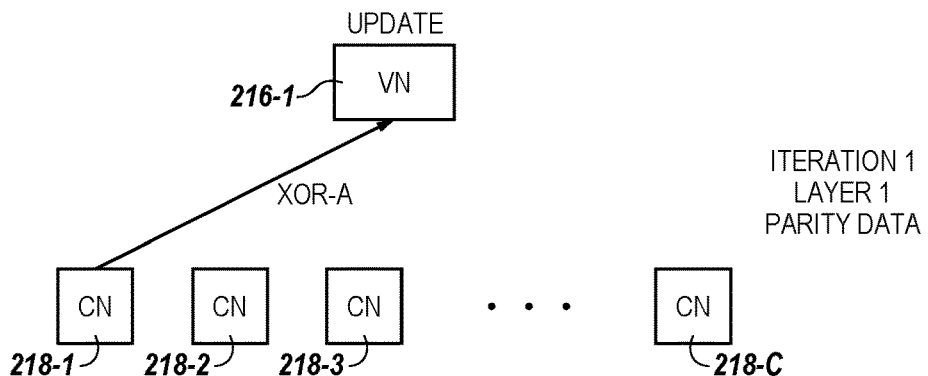

FIG. 2E illustrates a first check node 218-1 of the check nodes 218-1, 218-2, 218-3, . . . , 218-C coupled to the variable node 216-1 sending parity data (e.g., "XOR-A") to the variable node 216-1 in the first layer of the first iteration. The parity data sent by the first check node 218-1 can be based at least in part (e.g., in some embodiments, based only) on hard data sent by the variable node 216-1 and other variable nodes (not illustrated). In the first layer, the variable node 216-1 can update the reliability data stored therewith based at least in part (e.g., in some embodiments, based only) on the parity data received from the first check node 218-1. Updating the reliability data in response to the parity data can include updating the parity data because of the reception of the parity data (e.g., receiving the parity data causes the reliability data to be updated). Updating the reliability data based at least in part (e.g., in some embodiments, based only) on the parity data can include incrementing or decrementing the reliability data value according to a value of the received parity data. For example, if the parity data XOR-A is a first value (e.g., binary "1"), then the variable node 216-1 can increment the reliability data and if the parity data XOR-A is a second value (e.g., binary "0"), then the variable node 216-1 can decrement the reliability data. Incrementing and/or decrementing the reliability data can include incrementing and/or decrementing the reliability data by a predetermined amount unless the incrementing or decrementing of the stored reliability data value would exceed a predetermined range for the reliability data value. Although not specifically illustrated in FIG. 2E, the check node 218-1 can send updated reliability data with the parity data to the particular variable node 216-1. In the first layer, the variable node 216-1 can update the reliability data stored therewith based at least in part (e.g., in some embodiments, based only) on the updated reliability data received from the first check node 218-1.

Figure 2F:
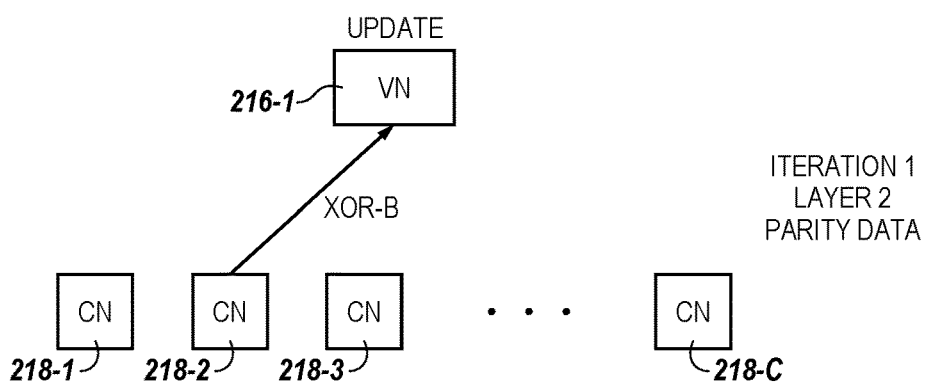

FIG. 2F illustrates a second check node 218-2 of the check nodes 218-1, 218-2, 218-3, . . . , 218-C coupled to the variable node 216-1 sending parity data (e.g., "XOR-B") to the variable node 216-1 in a second layer of the first iteration. In the second layer, the variable node 216-1 can update the reliability data stored therewith based at least in part (e.g., in some embodiments, based only) on the parity data received from the second check node 218-2. Although not specifically illustrated in FIG. 2F, the check node 218-2 can send updated reliability data with the parity data to the particular variable node 216-1. In the second layer, the variable node 216-1 can update the reliability data stored therewith based at least in part (e.g., in some embodiments, based only) on the updated reliability data received from the first check node 218-2.

Figure 2G:
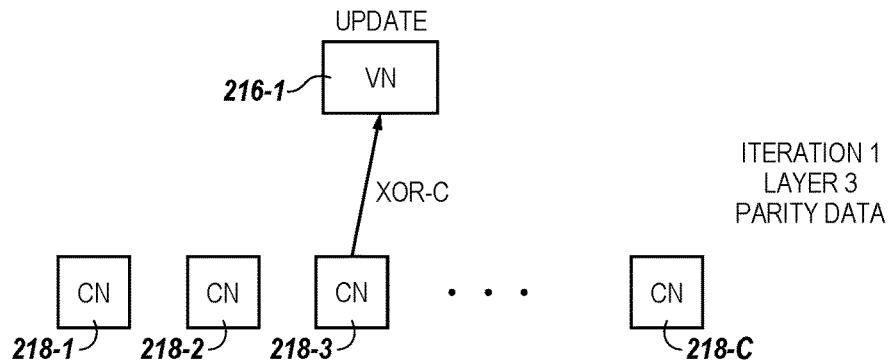

FIG. 2G illustrates a third check node 218-3 of the check nodes 218-1, 218-2, 218-3, . . . , 218-C coupled to the variable node 216-1 sending parity data (e.g., "XOR-C") to the variable node 216-1 in a third layer of the first iteration. In the third layer, the variable node 216-1 can update the reliability data stored therewith based at least in part (e.g., in some embodiments, based only) on the parity data received from the third check node 218-3. Although not specifically illustrated in FIG. 2G, the check node 218-3 can send updated reliability data with the parity data to the particular variable node 216-1. In the third layer, the variable node 216-1 can update the reliability data stored therewith based at least in part (e.g., in some embodiments, based only) on the updated reliability data received from the first check node 218-3.

Figure 2H:
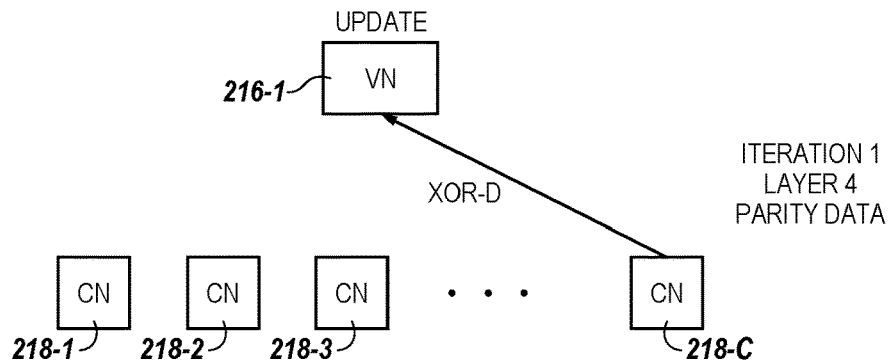

FIG. 2H illustrates a fourth check node 218-C of the check nodes 218-1, 218-2, 218-3, . . . , 218-C coupled to the variable node 216-1 sending parity data (e.g., "XOR-D") to the variable node 216-1 in a fourth layer of the first iteration. In the fourth layer, the variable node 216-1 can update the reliability data stored therewith based at least in part (e.g., in some embodiments, based only) on the parity data received from the fourth check node 218-C. Although not specifically illustrated in FIG. 2H, the check node 218-C can send updated reliability data with the parity data to the particular variable node 216-1. In the fourth layer, the variable node 216-1 can update the reliability data stored therewith based at least in part (e.g., in some embodiments, based only) on the updated reliability data received from the first check node 218-C.

Each layer can include receiving an input from less than all (e.g., a respective one of the check nodes 218-C) of the check nodes 218-1, 218-2, 218-3, . . . , 218-C and updating the reliability data based at least in part (e.g., in some embodiments, based only) on the input (e.g., parity data and/or updated reliability data) from the respective one of the check nodes 218-1, 218-2, 218-3, . . . , 218-C. Although not specifically illustrated, some embodiments can include updating the reliability data every L-number (e.g., where L is a variable from 1 layer to all layers, where the reliability data can be updated every layer, every other layer, every third layer, and so on, up to once per iteration) of the number of layers include updating the reliability data based on the input from the respective ones of the plurality of check nodes. In a number of embodiments, the layered updating can proceed until the variable node 216-1 has received an input from each of the plurality of check nodes 218-1, 218-2, 218-3, . . . , 218-C. The layered incrementing or decrementing of the stored reliability data value at the variable node 216-1 for all of the number of check nodes 218-1, 218-2, 218-3, . . . , 218-C coupled thereto can be completed for one iteration before sending a subsequent (updated) hard data value from the variable node 216-1 to each of the check nodes 218-1, 218-2, 218-3, . . . , 218-C.

Figure 2I:
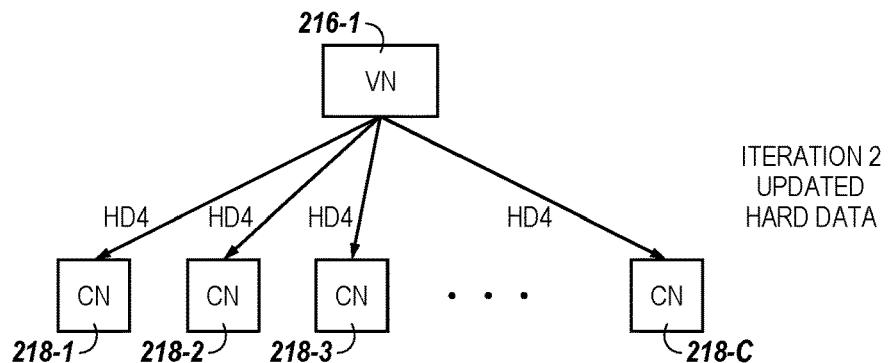

FIG. 2I illustrates the variable node 216-1 sending updated hard data corresponding to the updated reliability data to each of the check nodes 218-1, 218-2, 218-3, . . . , 218-C. For example, the variable node 216-1 can send updated hard data "HD4" to check nodes 218-1, 218-2, 218-3, . . . , 218-C. Because the updated hard data "HD4" represents the hard data corresponding to the updated reliability data stored in association with the variable node 216-1, the same hard data value "HD4" can be sent to each of the check nodes 218-1, 218-2, 218-3, . . . , 218-C coupled to the variable node 216-1 after the layered updating. For example, the updated hard data can be an MSB of the updated reliability data (e.g., where the updated reliability data is an LLR). In a number of embodiments, the variable node 216-1 can send updated reliability data including the updated hard data. Sending the updated hard data from the variable node 216-1 to the check nodes 218-1, 218-2, 218-3, . . . , 218-C can represent the beginning of a second iteration. The layered updating and sending of updated hard data can repeat iteratively until a particular number of iterations have been performed and/or until a syndrome check performed by the check nodes 218-1, 218-2, 218-3, . . . , 218-C is correct.

Figure 3:
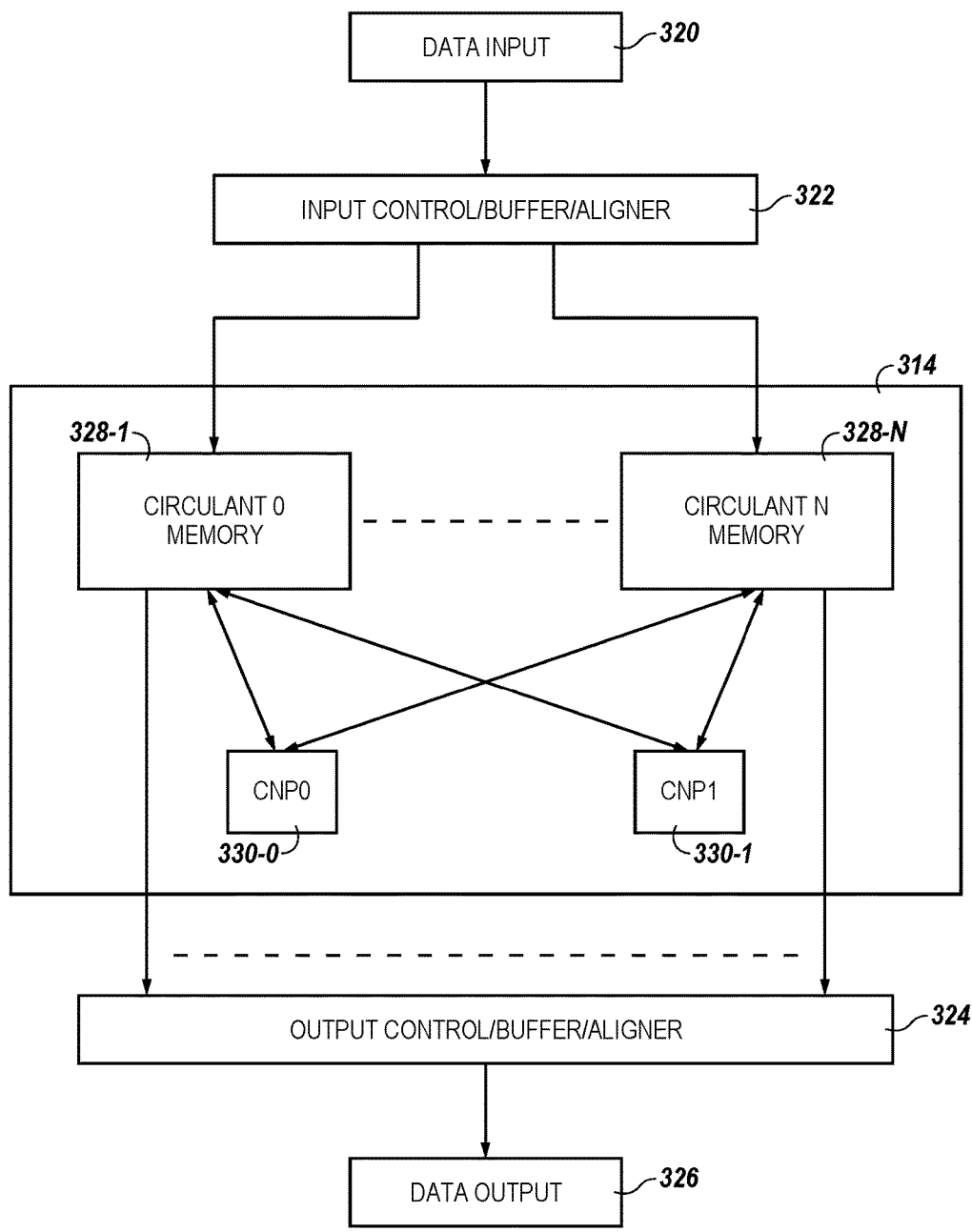
FIG. 3 illustrates a block diagram of an apparatus including an error correction circuit in accordance with a number of embodiments of the present disclosure.

FIG. 3 illustrates a block diagram of an apparatus including an error correction circuit 314 in accordance with a number of embodiments of the present disclosure. A data input 320 can be provided from a memory device (e.g., memory device 110-1 illustrated in FIG. 1) via a reliability circuit (e.g., reliability circuit 112 illustrated in FIG. 1). The data can be input to an input control/buffer/aligner 322. Although not specifically illustrated, the input control/buffer/aligner 322 can receive control and status information from control circuitry to arrange timing and signaling between the input 320 and the error correction circuit 314. The input control/buffer/aligner 322 can receive reliability data including hard data (e.g., a number of codewords) and provide the same (e.g., a circulant aligned hard data input expanded to three bits per LLR with one bit of hard data and two bits of reliability data) to a plurality of circulant memories 328-1, . . . , 328-N. In a number of embodiments, the input control/buffer/aligner 322 can receive semi-soft or full-soft data (e.g., in response to a failed syndrome check).

The number (N) of circulant memories 328-1, . . . , 328-N can be equal to a total number of circulants in an H matrix (representing the parity check code) row. A circulant memory 328-1 can store a circulant matrix that is specified by one vector that can appear in one of the columns of the circulant matrix, where the remaining columns are cyclic permutations of the vector with an offset equal to the column index. For example, an H matrix can include 20,480 columns and 2,048 rows representing the parity check code. Each variable node can have its own column in the H matrix. Each row can represent a parity check constraint and each column can represent one bit of a received codeword. The H matrix can be broken into smaller matrices called circulants (e.g., 512×512 matrices). Each layer of decoding can consist of a single row of circulants and each entry in the circulant can be a parity check, where each layer processes inputs from less than all (e.g., only one) of the check nodes. The circulant memories 328-1, ..., 328-N can exchange control and/or status information therebetween and/or with control circuitry.

The circulant memories 328-1, ..., 328-N can be coupled to a number of check node processors 330-0, ..., 330-1 according to the parity check code. The circulant memories 328-1, ..., 328-N can send hard data and reliability data to the check node processors 330-0, ..., 330-1. The check node processors can receive the reliability data including the hard data, compute parity data (updated hard data), update the reliability data based at least in part (e.g., in some embodiments, based only) on the parity data, and output the updated reliability data including updated hard data to the circulant memories 328-1, ..., 328-N. Although only two check node processors 330-0, ..., 330-1 are illustrated in FIG. 3, embodiments are not so limited as more or fewer check node processors can be included with an error correction circuit 314. The check node processors 330-0, ..., 330-1 can exchange control and/or status information therebetween and/or with control circuitry.

The circulant memories 328-1, ..., 328-N can output updated hard data to the output control/buffer/aligner 324. In a number of embodiments, the circulant memories 328-1, ..., 328-N do not output the reliability data to the output control/buffer/aligner 324. Although not specifically illustrated, the output control/buffer/aligner 324 can exchange control and/or status information with control circuitry and/or with the circulant memories 328-1, ..., 328-N. The output control/buffer/aligner 324 can output the hard data to an output 326 (e.g., an output to a host).

Figure 4:
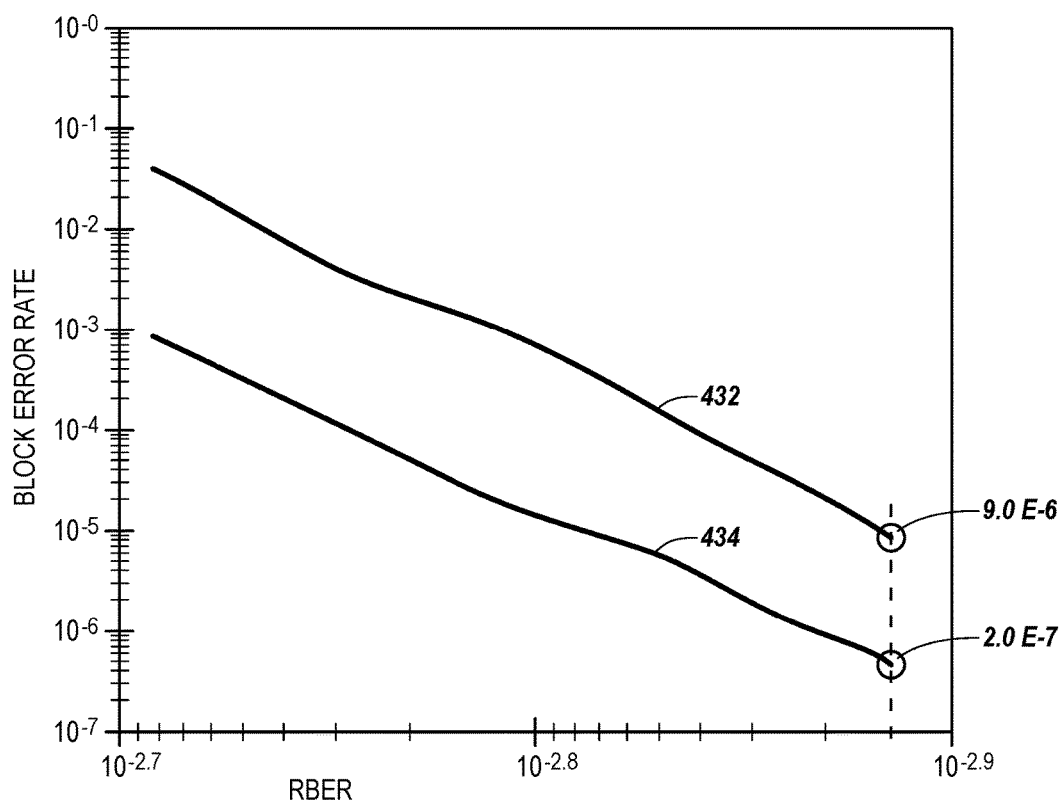
FIG. 4 is a plot illustrating block error rate versus raw bit error rate (RBER) according to various approaches including at least one in accordance with a number of embodiments of the present disclosure.

FIG. 4 is a plot illustrating block error rate versus raw bit error rate (RBER) according to various approaches including at least one in accordance with a number of embodiments of the present disclosure. The plot is comparing the block failure rate using a four bit min-sum algorithm for error correction (e.g., first curve 432 according to some previous approaches) versus using a three-bit algorithm according to a number of embodiments of the present disclosure (e.g., second curve 434) with hard data inputs. The first curve 432 is the block failure rate with four bits of reliability data including one bit of hard data as an input to the min-sum error correction algorithm. The second curve 434 is the block failure rate with three bits of reliability data including one bit of hard data as an inputs to the error correction algorithm according to a number of embodiments of the present disclosure. The min-sum approach can have a block error rate of $9.0 \times 10^{-6}$, whereas the error correction algorithm according to a number of embodiments of the present disclosure can have a block error rate of $2.0 \times 10^{-7}$ for a same RBER. Although not specifically illustrated in FIG. 4, the error correcting performance can be further improved with the use of semi-soft or full-soft data.

Some advantages of a number of embodiments of the present disclosure over a four-bit min-sum approach include lower complexity error correction circuitry. For example the variable nodes can be implemented as up/down counters with associated memory (or, simply as memory when the check node provides the up/down counting functionality), and the check nodes can be implemented as combinational logic (e.g., XOR gates and/or up/down counters). Furthermore, the error correction can be implemented in a bit-serial decoding approach. Using three bits of data (hard data and reliability data) provides for 25% less memory usage than using four bits of data. Error correction circuitry according to the present disclosure can be implemented without memory resources between the variable nodes and the check nodes, for example to store output bits of the variable nodes and/or the check nodes.

CONCLUSION

The present disclosure includes apparatuses and methods related to updating reliability data. A number of methods can include receiving, at a variable node, either a first reliability data value with a first hard data value or a second reliability data value with a second hard data value, sending the first hard data value or the second hard data value to each check node coupled to the variable node according to a parity check code, and updating the reliability data based on input from less than all of the check nodes.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a memory device;
    a reliability circuit coupled to the memory device and configured to receive hard data from the memory device and to determine reliability data assigned thereto, the reliability data comprising a first reliability data value in response to the hard data comprising a first value or comprising a second reliability data value in response to the hard data comprising a second value;
    an error correction circuit coupled to the reliability circuit and configured to receive the hard data and the reliability data from the reliability circuit, wherein the error correction circuit is further configured to:
        iteratively compute parity data for the hard data; and
        increment or decrement the reliability data once per L-number of layers of parity data, wherein one iteration includes a plurality of layers of parity data.

2. The apparatus of claim 1, wherein the error correction circuit includes:
    a plurality of check nodes comprising combinational logic configured to iteratively compute the parity data for the hard data; and a plurality of variable nodes comprising up/down counters configured to update the reliability data.

3. The apparatus of claim 1, wherein the error correction circuit includes a plurality of check nodes configured to iteratively compute the parity data for the hard data and to increment or decrement the reliability data.

4. The apparatus of claim 1, wherein the error correction circuit is coupled to a host and configured to provide the hard data to the host in response to either a particular number of iterations being performed or in response to a syndrome check on the hard data being correct.

5. The apparatus of claim 1, wherein the reliability circuit comprises a log likelihood ratio (LLR) circuit and the error correction circuit comprises a low density parity check (LDPC) circuit.

6. An apparatus, comprising:
a plurality of circulant memories;
a plurality of check nodes coupled to the plurality of circulant memories according to a parity check code; and
wherein the plurality of circulant memories are each configured to provide respective hard data and respective reliability data to those of the plurality of check nodes coupled thereto; and
wherein the plurality of check nodes are each configured to compute parity data for received hard data, update received reliability data based at least in part on the parity data, and send the parity data and updated reliability data to those of the circulant memories coupled thereto.

7. The apparatus of claim 6, wherein the apparatus includes:
an input coupled to the plurality of circulant memories, the input configured to provide hard data and reliability data thereto; and
an output coupled to the plurality of circulant memories and configured to receive hard data therefrom; and
wherein the plurality of check nodes are configured to perform a syndrome check based on the hard data received from the plurality of circulant memories.

8. The apparatus of claim 7, wherein the input is configured to provide semi-soft data to the circulant memories in response to the syndrome check failing for the hard data.

9. The apparatus of claim 8, wherein the input is configured to provide full-soft data in response to the syndrome check failing for the semi-soft data.

10. A method, comprising:
determining, with a reliability circuit, reliability data assigned to hard data received from a memory device, the reliability data comprising a first reliability data value in response to the hard data comprising a first value or comprising a second reliability data value in response to the hard data comprising a second value;
iteratively computing parity data for the hard data received from the reliability circuit with an error correction circuit; and
incrementing or decrementing the reliability data received from the reliability circuit with the error correction circuit once per L-number of layers of parity data, wherein one iteration includes a plurality of layers of parity data.

11. The method of claim 10, wherein iteratively computing the parity data comprises iteratively computing the parity data with a plurality of check nodes of the error correction circuit.

12. The method of claim 11, wherein updating the reliability data comprises updating the reliability data with a plurality of variable nodes of the error correction circuit.

13. The method of claim 10, wherein iteratively computing the parity data and incrementing or decrementing the reliability data comprises iteratively computing the parity data and incrementing or decrementing the reliability data with a plurality of check nodes of the error correction circuit.

14. The method of claim 10, wherein the method includes the error correction circuit providing the hard data to a host in response to either a particular number of iterations being performed or in response to a syndrome check on the hard data being correct.

15. A method, comprising:
providing, from each of a plurality of circulant memories, respective hard data and respective reliability data to those of a plurality of check nodes coupled thereto;
computing parity data for received hard data with each of the plurality of check nodes;
updating received reliability data based at least in part on the parity data with each of the plurality of check nodes; and
sending, from each of the plurality of check nodes, the parity data and updated reliability data to those of the circulant memories coupled thereto.

16. The method of claim 15, wherein the method includes providing hard data and reliability data from an input of the plurality of circulant memories.

17. The method of claim 16, wherein the method includes receiving hard data from an output of the plurality of circulant memories.

18. The method of claim 17, wherein the method includes performing a syndrome check based on the hard data received from the plurality of circulant memories with the plurality of check nodes.

19. The method of claim 18, wherein the method includes providing semi-soft data to the circulant memories in response to the syndrome check failing for the hard data.

20. The method of claim 19, wherein the method includes providing full-soft data in response to the syndrome check failing for the semi-soft data.

* * * * *